United States Patent
Zhang et al.

(10) Patent No.: US 9,256,703 B1
(45) Date of Patent: Feb. 9, 2016

(54) METHOD OF DETECTING A SCATTERING BAR BY SIMULATION

(71) Applicants: Semiconductor Manufacturing International (Beijing) Corporation, Beijing (CN); Semiconductor Manufacturing International (Shanghai) Corporation, Shanghai (CN)

(72) Inventors: Wanjuan Zhang, Shanghai (CN); Yibin Huang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/491,732

(22) Filed: Sep. 19, 2014

(51) Int. Cl.
*G06F 17/50* (2006.01)

(52) U.S. Cl.
CPC ........ *G06F 17/5009* (2013.01); *G06F 17/5045* (2013.01)

(58) Field of Classification Search
CPC ........... G03F 1/36; G03F 7/705; G03F 1/144; G03F 7/70441; G06F 17/5068; G06F 17/5081; G06F 17/5009; G06F 17/5045
See application file for complete search history.

(56) References Cited

U.S. PATENT DOCUMENTS

| | | | | |
|---|---|---|---|---|
| 7,913,196 B2* | 3/2011 | Wu | ...................... | G06F 17/5081 430/30 |
| 8,458,626 B1* | 6/2013 | Tirapu-Azpiroz | ........ | G03F 1/36 716/54 |
| 2007/0032896 A1* | 2/2007 | Ye | ....................... | G03F 7/70516 700/108 |
| 2007/0292777 A1* | 12/2007 | Melvin | .................... | G03F 1/144 430/30 |
| 2008/0304029 A1* | 12/2008 | Pforr | ....................... | G03F 1/144 355/44 |
| 2011/0091815 A1* | 4/2011 | Dunn | .................. | G03F 7/70441 430/313 |
| 2013/0000505 A1* | 1/2013 | Tao | ..................... | G03F 7/70441 101/450.1 |
| 2014/0040838 A1* | 2/2014 | Liu | ..................... | G06F 17/5068 716/53 |

\* cited by examiner

*Primary Examiner* — Nha Nguyen
(74) *Attorney, Agent, or Firm* — Kilpatrick Townsend & Stockton LLP

(57) ABSTRACT

A method of testing a scattering bar by simulation includes preparing an OPC mask model including a main pattern and a scattering bar pattern, forming a scattering bar OPC model by adjusting an image plane of the OPC mask model located at a middle portion of a photoresist layer to a top portion of the photoresist layer, simulating an exposure of the scattering bar OPC model, simulating a profile of the exposed scattering bar OPC model, and testing the simulated profile.

13 Claims, 3 Drawing Sheets

METHOD OF DETECTING A SCATTERING BAR BY SIMULATION

FIELD OF THE INVENTION

The present invention relates generally to semiconductor technology. More particularly, embodiments of the present invention provide a method of testing a scattering bar by simulation.

BACKGROUND

IC manufacturing technology is a complex process that advances rapidly. A key parameter to characterize the integrated circuit manufacturing technology is the minimum feature size, i.e., critical dimension (CD). Ongoing shrinkage of the critical dimension of circuit elements, even down to nanoscale width, has made it possible to integrate millions of devices on a chip.

Lithography is the driving force for the development of integrated circuit manufacturing technology, and is also one of the most sophisticated process. Lithography plays an important role in the integrated circuit manufacturing processes. Before starting a lithographic process, a pattern is transferred to a mask using a specific apparatus, and then the pattern of the mask is imaged onto a substrate (silicon wafer) using a specific wavelength of light through a lithographic apparatus to produce chips. However, due to the reduced size of semiconductor devices, distortion occurs in the transfer of mask pattern onto the wafer, and the distortion may cause failures of the manufacturing processes. Therefore, in order to solve the above problems, optical proximity correction (OPC) techniques are utilized to modify the mask to compensate for optical proximity effect of the exposure system.

In order to increase the contrast of the pattern in the OPC process, the target pattern (alternatively referred to as "main pattern" hereinafter) and scattering bar (alternatively referred to as "sbar" hereinafter) are generally formed on the mask. The scattering bar is disposed around the main pattern to generate optical proximity effects and are not formed on the wafer after exposure. The scattering bar may have various shapes such as long sham, block sham, etc. in general, conventional techniques use the middle portion of the image plane of a photoresist layer to collect data for the calibration of the OPC model of the main pattern, and simulate the sbar under an overexposure condition. However, due to the smaller size of sbar, light intensity of the sbar in the photoresist layer is much smaller than the light intensity of the main pattern, so that only the sbar is imaged onto the top surface of the photoresist layer, and the image plane of a conventional OPC template is imaged in the middle portion of the photoresist layer, so that it is not possible to accurately detect the sbar printing, and it is thus likely to have the sbar formed onto the wafer, resulting in device failure and low production yield.

Although the conventional method includes the simulation of the image plane of the main pattern and the sbar pattern and collection of data associated with the simulation, however, the simulation is only accurate in connection with the main pattern. Due to the small size of the sbar and the image plane on the top surface of the photoresist layer, the conventional method is not able to accurately simulate the sbar. Therefore, a need exists for an improved method to accurately simulate the sbar.

SUMMARY OF THE INVENTION

As described above, testing solutions are needed to achieve the accuracy and efficiency that users require from a semiconductor manufacturing process. The present disclosure relates to a method of testing a scattering bar using simulation. The method comprises the steps of (a) preparing an optical proximity correction (OPC) mask model that includes a main pattern and a scattering bar pattern, (b) forming a scattering bar OPC model by adjusting an image plane of a middle portion of a photoresist layer to a top portion of the photoresist layer; (c) simulating an exposure of the scattering bar OPC model, simulating a profile of the exposed scattering bar OPC model, and testing the simulated profile of the exposed scattering bar.

In an embodiment, after step (a), the method further comprises obtaining data associated with an image plane of the main pattern located at the middle portion of the photoresist layer, and forming the OPC mask model based on the obtained data.

In an embodiment, after the step (b), the method also includes obtaining data associated with the scattering bar located at the top portion of the photoresist, and adjusting the scattering bar OPC model based on the obtained data.

In an embodiment, after the step (c), the method also includes while simulating the exposure of the scattering bar OPC model, establishing a correlation between an amount of a simulated exposure energy of the scattering bar and an amount of a real exposure energy of a wafer.

In an embodiment, the correlation is established using a test pattern of the scattering bar.

In an embodiment, preparing an OPC mask model in step (a) includes sequentially depositing a bottom antireflective layer, a photoresist layer, and a top coat layer.

In an embodiment, adjusting an image plane of a middle portion of the OPC mask model at a middle portion of the photoresist layer includes adjusting an interface between the photoresist layer and the top coat layer.

In an embodiment, the method in step (c) further includes simulating the main pattern based on the OPC mask model, and monitoring an image of the main pattern based on a simulation result of the main pattern.

In an embodiment, the method may include disposing the scattering bar around the main pattern to improve an image contrast.

In an embodiment, the scattering bar may have a rectangular shape, a square, a polygonal shape, or one or more regular or irregular shapes.

In an embodiment, the method in step (c) further includes overexposing the scattering bar OPC model to simulate an image the overexposed scattering bar.

In an embodiment, the scattering bar OPC model in step (b) is used only for the simulation of the profile of scattering bar.

According to embodiments of the present invention, the image plane of the OPC mask model is moved to the top surface of the OPC mask model to form a new OPC model that is a scattering bar OPC model. The scattering bar OPC model is used for the simulation of a scattering profile. A profile of the scattering bar can be obtained through the simulation of an exposure of the scattering bar OPC model to detect the scattering bar. The simulation result of the exposed scattering bar OPC model is consistent with the result obtained with real exposure of a wafer. Therefore, the method according to embodiments of the present invention provides a more efficient and accurate way to detect a scattering bar.

Embodiments of the present invention provide a method that can effectively and accurately detect and monitor a scattering bar. The method can also generate a true correlation between an amount of a simulated exposure energy of the scattering bar and an amount of a real exposure energy of a wafer. The real exposure energy amount of a wafer can be obtained through the simulated exposure energy amount so that this testing and monitoring method is simple and efficient.

The invention will become fully apparent from the following detailed description in conjunction with the accompanying drawings.

DETAILED DESCRIPTION OF THE INVENTION

Figure 1:
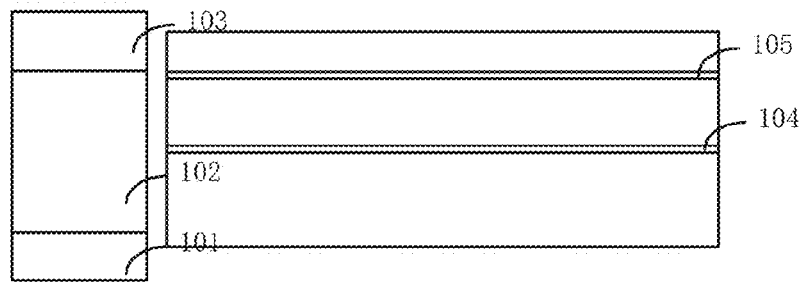
FIG. 1 is a simplified cross-sectional view illustrating image planes of a mask according to an embodiment of the present invention.

Embodiments of the present invention now will be described more fully hereinafter with reference to the accompanying drawings, in which embodiments of the invention are shown. The invention may, however, be embodied in many different forms and should not be construed as limited to the embodiments set forth herein.

It will be understood that the terms "comprises", "comprising", "includes", "including" when used herein, specify the presence of stated features, integers, steps, operations, elements and/or components, but do not preclude the presence or addition of one or more other features, integers, steps, operations, elements and/or components. The use of the terms "first", "second", etc. do not denote any order, but rather the terms first, second, etc. are used to distinguish one element from another. Furthermore, the use of the terms "a", "an", etc. does not denote a limitation of quantity, but rather denote the presence of at least one of the referenced items.

As described above, conventional simulation techniques do not provide accurate simulation model of sbar. Embodiments of the present invention provide a method that can accurately simulate an image of scattering bar of an OPC mask model so that a pattern is not form on a wafer during exposure to improve the wafer yield. To achieve the above objective, the method includes forming a new OPC model by adjusting the image plane of an OPC mask model located at a middle portion of a photoresist layer to a top portion of the photoresist layer to form a new OPC model. The new OPC model is a scattering bar OPC model, which is only used to simulate a profile. The method also includes obtaining the simulated profile of the scattering bar through an exposure simulation of the scattering bar OPC model, and testing the image of the scattering bar to improve the accuracy of the image pattern detection.

The present invention provides a method for detecting a simulated image of a scattering bar. The method includes the following steps:

Step (a): Preparing an OPC mask model, the OPC mask model includes a main pattern and a scattering bar pattern;

Step (b): Forming a scattering bar OPC model by adjusting an image plane of the OPC mask model located at a middle portion of a photoresist to a top portion of the photoresist layer;

Step (c): Simulating an exposure of the scattering bar OPC model, simulating a profit of the exposed scattering bar, and testing the simulated profile of the exposed scattering bar.

In an embodiment, the method includes using the image plane of the middle portion of the photoresist to form a second image plane. The method further includes, after the formation of the second image plane, obtaining data associated with the main pattern of the second image plane, such as data associated with the shape, the critical dimension of the main pattern, and generating a corrected OPC mask model based on the obtained data.

Furthermore, the method also includes adjusting the image of the second image plane to the top image plane of the photoresist based on the corrected OPC mask model to form a first image plane. The method also includes obtaining data associated with the first image plane of the scattering bar, such as data associated with the shape, the critical dimension, and generating the scattering bar OPC model according to the corrected OPC mask model. Only the profile of the scattering bar is simulated, and the scattering bar OPC model is independent from the corrected OPC mask model.

In addition, in order to obtain a more efficient simulation, the method includes establishing a correlation between an amount of simulated exposure energy of the scattering bar and an amount of a real exposure energy of a wafer, and effectively determining an amount of an actual exposure of the wafer according to the simulated exposure. In a specific embodiment, the correlation is established using a test pattern of the scattering bar.

Furthermore, step (a) includes sequentially depositing a bottom antireflective layer, a photoresist layer, and a top coat layer, forming a second image plane at the middle portion of the photoresist layer, and obtaining data associated with the second image plane of the main pattern, such as the shape and critical dimension of the main pattern. The method also includes generating an OPC mask model based on the obtained data.

Thereafter, the method includes moving the focus of the second image plane to a first image plane disposed between the photoresist layer and the top coat layer (which is disposed on the top surface of the photoresist layer), and forming a first image plane. The method further includes obtaining data associated with the first image plane of the scattering bar, such as the shape and critical dimension of the scattering bar. The method may include disposing the scattering bar around the main pattern, and correcting the OPC mask model according to the corrected main pattern based on the obtained data to generate the scattering bar model. The method also includes simulating the profile of the scattering bar, which is independent from the corrected OPC mask model.

First Embodiment

A method for optical proximity correction according to a first embodiment of the present invention is described in detail below.

As shown in FIG. 1, the method includes forming an OPC mask model. The OPC mask model is forming by sequentially depositing a bottom anti-reflection layer (BARC) 101, a photoresist layer 102, and the top coat layer 103. For a better detection of the scattering bar imaging of the mask model, the method includes forming a first image plane 105 on the top surface of photoresist layer 102, first image plane 105 is disposed between photoresist layer 102 and top coat layer 103. First image plane 105 is closer to the scattering bar (sbar) of the mask so that a simulation of the shape and critical dimension of sbar can be achieved to improve the simulation accuracy of the sbar.

In an embodiment, the method includes forming an image plane in the middle portion of photoresist layer 102, which is referred to as a second image plane 104. Second image plane 104 is used for detection of a main pattern. After forming a second image plane 104 in the middle portion of photoresist layer 102, the method further includes obtaining data associated with the second image plane 104 of a wafer, and correcting the mask based on the obtained data. The method also includes simulating a normal exposure of the corrected OPC mask model for the image detection and monitoring of the main pattern.

After correcting the OPC mask model based on the data associated with the wafer, the method includes moving the second image plane 104 to the top surface of the photoresist layer 102 to obtain a first image plane 105.

Thereafter, the method includes obtaining data associated with the sbar through the first image plane 105, optical proximity correction (OPC) adjusting the corrected OPC mask model to obtain a scattering bar OPC model. The method further includes simulating an exposure of the scattering bar OPC model to obtain a simulated profile of the scattering bar, the simulated profile of the scattering bar is consistent with an image of a real exposure of the wafer, in order to achieve the imaging detection of the star.

Figure 2A:
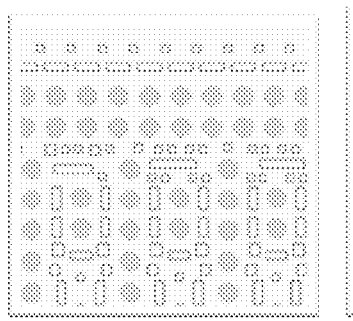
FIG. 2A is a top view of an image plane of the middle portion of the photoresist layer after a simulation with an exposure of a sbar according to an embodiment of the present invention.
Figure 2B:
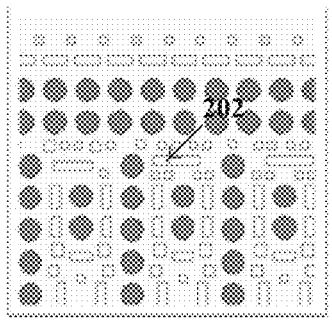
FIG. 2B is a top view of an image plane at the top surface of the photoresist layer corresponding to the simulation of the sbar after a correction of the mask according to an embodiment of the present invention.
Figure 2C:
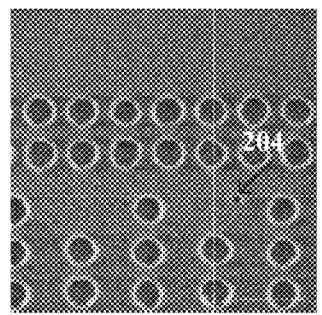
FIG. 2C is a top view of an image plane after an exposure of a real wafer according to an embodiment of the present invention.

In order to verify the accuracy of the simulated scattering bar, the method according to an embodiment of the present invention includes conducting a real water exposure of OPC mask model to evaluate the results of the simulation, In an exemplary embodiment, as shown in FIGS. 2A-2C, FIG. 2A shows the image plane of the middle portion of the photoresist layer. The image plane corresponds to a result of adjusted corrected mask based on data obtained after a simulation of the sbar with an exposure of a wafer with an overdose of 15%. It can be seen from FIG. 2A, the exposed sbar pattern is not formed on the wafer.

In FIG. 2B, when the image plane is set at the top surface of the photoresist layer (a surface between resist layer 102 and top coat layer 103), the image plane corresponds to the simulated sbar after the mask is corrected based on data obtained by 15% over-exposure. It can be seen from FIG. 2B, a pattern (a black spot) is formed on a wafer through the exposure of the sbar, as indicated by an arrow 202. Therefore, a simulation of sbar may produce different results according to the OPC mask model formed at different locations.

FIG. 2C is an image plane after a real exposure of a wafer. In an embodiment, the method includes forming an OPC mask model, the OPC mask model is actually a lithographic process model of a "printing film" of a photoresist layer, that is printed on a layout geometry of an original IC design. In other words, forming a circuit pattern on the wafer from the original integrated circuit design layout requires the steps of making a mask and a negative print of an integrated circuit design layout of the original lithography mask pattern. The lithography process is to image the "negative print" onto a wafer to form a circuit pattern on the wafer.

Lithography mask platemaking process is as follows: First, forming a chromium film plate having a chromium nitride light-sensitive material by de magnetron sputtering deposition of nitrogen chromium oxide film on a flat and smooth glass (or quartz); then, uniformly coating the plate with a photoresist layer or an electron beam resist, the plate covered with a spin coated chrome is a photomask substrate. It is ideal for making a photosensitive blank with a small geometry. Finally, the lithography mask making is completed with the original IC design layout geometry printed onto the photomask substrate by a photolithographic process. The mask may include a bottom anti-reflection (BARC) 101, a photoresist layer 102, and a top coat layer 103 that are sequentially deposited on the glass (quartz).

According to an embodiment, the method includes, from the middle portion 104 of the photoresist layer 102, obtaining data associated with the wafer, which is under an over-exposure by 10% of the exposure mask to transfer the pattern of the OPC mask model to the wafer for the production of silicon chips. FIG. 2C is the pattern after an exposure of the corrected mask with an exposure energy over 10%. As it can be seen, the pattern after the exposure contains the scattering bar pattern shown as a black dot, indicated by an arrow 204 in FIG. 2C.

As described above, due to the relatively small size of the sbar, light intensity of the sbar is much smaller than the light intensity of the main pattern. When the simulation of the sbar obtained by the image plane of the light provided to the middle portion of the photoresist is inaccurate, the image obtained in the exposed wafer is defective. When the image plane is formed on the top surface of the photoresist layer the simulated sbar pattern is the same as the pattern of the wafer after the exposure, the simulation result is thus more accurate.

Second Embodiment

A method for optical proximity correction according to a second embodiment of the present invention includes forming an OPC mask model. As shown in FIG. 1, the mask comprises a bottom anti-reflection layer (BARC) 101, a photoresist layer 102, and a top coat layer 103, which are sequentially formed on a transparent substrate. For a better detection of the scattering bar image of the OPC mask model, the method includes forming a first image plane 105 on the top surface of photoresist layer 102, first image plane 105 is disposed between photoresist layer 102 and top coat layer 103. First image plane 105 is closer to the scattering bar of the mask so that a simulation of the shape and critical dimension of sbar can be achieved to improve the simulation accuracy of the sbar.

In an embodiment, the method includes forming the image plane in the middle portion of photoresist layer 102, which is referred to as a second image plane 104. Second image plane 104 is used for detection of a main pattern. After forming the second image plane 104 in the middle portion of photoresist layer 102, the method further includes obtaining data associated the second image plane 104 of a wafer, and correcting the mask based on the obtained data. The method also includes simulating a nominal exposure of the corrected OPC mask model for the image detection and monitoring of the main pattern.

After correcting the OPC mask model based on the data associated with the wafer, the method includes moving the second image plane 104 to the top surface of the photoresist layer 102 to obtain a first image plane 105.

Thereafter, the method includes Obtaining data associated with the sbar through the first image plane 105, OPC adjusting the corrected OPC mask model to obtain a scattering bar OPC model. The method further includes obtaining a profile of the scattering bar through simulating an exposure of the scattering bar OPC model, the simulated profile of the scattering bar is consistent with an image of a real exposure of the wafer, in order to achieve the image detection of the sbar.

In order to verify the accuracy of the simulated scattering bar, the method according to an embodiment includes conducting a real wafer exposure of OPC mask model to evaluate the results of the simulation.

In an embodiment, the method uses a nominal amount of exposure energy to simulate a main pattern with an adjusted OPC mask model. The method uses an overexposure to simulate a sbar OPC mask model, the overexposure dose may be of about 15% over a nominal dose.

The method further includes establishing a correlation between an simulated exposure energy amount of the scattering bar and a real exposure energy amount of the wafer. The obtained correlation between the simulated exposure energy amount of the sbar and the real exposure energy amount of the wafer may improve the simulation results for a better monitoring of an actual production.

In an embodiment, the correlation may be established by using sbar printing test patterns, the sbar printing test patterns may be selected from commonly used test patterns in the art, and they are not limited to any specific one. For example, a sbar printing may appear in a sbar simulation with a 15% sbar overdose, the sbar printing may appear with a 10% sbar overdose in the actual process of wafer exposure.

After establishing the correlation between an exposure energy amount of a simulated sbar printing (when the sbar pattern is transferred onto the wafer) and an actual exposure energy amount of a wafer, the actual exposure energy amount can be obtained through the simulated exposure energy amount, so that the invention provides a more convenient and efficient method for obtaining an actual exposure energy amount.

Figure 3A:
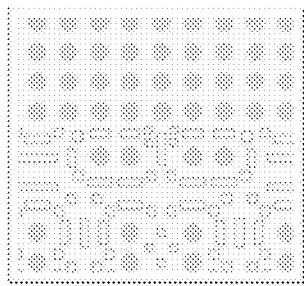
FIG. 3A is a top view of an image plane of the middle portion of the photoresist layer after a simulation with an exposure of the sbar according to an embodiment of the present invention.

FIG. 3A is an image plane of the middle portion of the photoresist layer obtained after a simulation with an exposure of the sbar with a 15% overdose with a mask that has been adjusted based on data obtained from the wafer. As it can be seen from FIG. 3A, the sbar does not form a pattern on the wafer after the exposure.

Figure 3B:
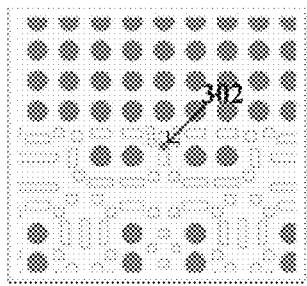
FIG. 3B is a top view of an image plane at the top surface of the photoresist layer corresponding to the simulation of the sbar after an adjustment of the mask according to an embodiment of the present invention.

In FIG. 3B, when the image plane is set at the top surface of the photoresist layer (the interface layer between resist layer 102 and top coat layer 103), the image plane corresponds to the simulated sbar after the mask is adjusted based on data obtained by a 15% over-exposure. It can be seen from FIG. 3B, a pattern (a black spot) is formed on a wafer through the exposure of the sbar, as indicated by an arrow 302. Therefore, a simulation of sbar may produce different results according to the OPC mask model formed at different locations.

Figure 3C:
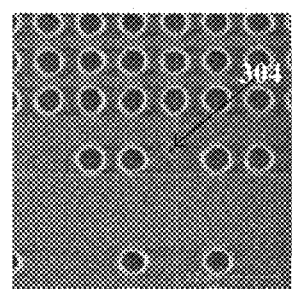
FIG. 3C is a top view of an image plane after an exposure of a real wafer according to an embodiment of the present invention.

FIG. 3C is an image plane after an exposure of the real wafer. In an embodiment, the method includes forming an OPC mask model, the OPC mask model is actually a lithographic process model of a "printing film" of a photoresist layer, that is printed on a layout geometry of an original IC design. In other words, forming a circuit pattern on the wafer from the original integrated circuit design layout requires making a mask and a negative print of an integrated circuit design layout of the original lithography mask pattern. The lithography process is to image the "negative print" onto a wafer to form a circuit pattern on the wafer.

Lithography mask making process may include the following steps: First, forming a chromium film plate having a chromium nitride light-sensitive material by dc magnetron sputtering deposition of nitrogen chromium oxide film on a flat and smooth glass (or quartz); then, uniformly coating the plate with a photoresist layer or an electron beam resist, the plate covered with a spin coated chrome is a photomask substrate. It is ideal for making a photosensitive blank with a small geometry. Finally, the lithography mask making is completed with the original IC design layout geometry printed onto the photomask substrate by a photolithographic process. The mask may include a bottom anti-reflection (BARC) 101, a photoresist layer 102, and a top coat layer 103 that are sequentially deposited on the glass (quartz).

According to an embodiment, the method includes, from the middle portion 104 of the photoresist layer 102, Obtaining data associated with the wafer, which is under an over-exposure by 10% of the exposure mask to transfer the pattern of the OPC mask model to the wafer for the production of silicon chips. FIG. 3C is the pattern after an exposure of the adjusted mask with a 10% overdose exposure energy. As it can be seen, the pattern after the exposure contains the scattering bar pattern shown as a black dot, indicated by an arrow 304 in FIG. 3C.

As described above, due to the relatively small size of the sbar, light intensity of the sbar is much smaller than the light intensity of the main pattern. When the simulation of the sbar obtained by the image plane of the light provided to the middle portion of the photoresist is inaccurate, the image obtained in the exposed wafer is defective. When the image plane is formed on the top surface of the photoresist layer the simulated sbar pattern is the same as the pattern of the wafer after the exposure, the simulation result is thus more accurate.

The main target and the number, shape and intensity pattern settings of sbar are different between FIGS. 3A-3C and FIGS. 2A-2C. These differences show the achieved efficiency and accuracy of the above-described exemplary method of the present invention to detect sbar images.

Third Embodiment

Figure 4A:
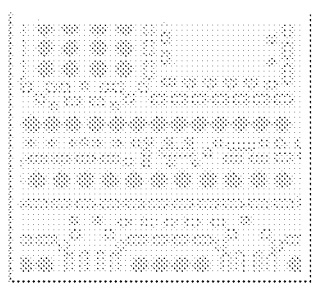
FIG. 4A is an image plane of the middle portion of the photoresist layer obtained after a simulation with an exposure of the sbar according to an embodiment of present invention.
Figure 4B:
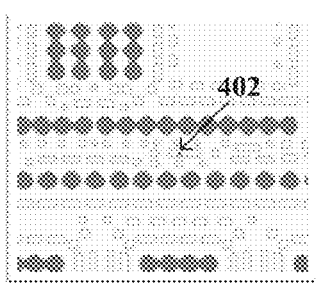
FIG. 4B is top view of an image plane at the top surface of the photoresist layer corresponding to the simulation of the sbar after an adjustment of the mask according to an embodiment of the present invention.
Figure 4C:
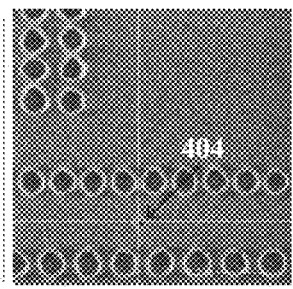
FIG. 4C is a top view of an image plane after an exposure of a real wafer according to an embodiment of the present invention.

The composition of the OPC mask model of a third embodiment differs from that of the second embodiment. In the third embodiment, the OPC model mask only includes a photoresist layer without a bottom anti-reflection layer and a top coat layer. In other words, the method for detecting a simulated image does not require the step of forming the second image plane 104 in the middle portion of photoresist layer as required in first and second embodiments. The remaining steps are similar to steps in the second embodiment. FIGS. 4A-4C are image planes showing simulated exposure of sbar pattern and real exposure of a wafer pattern.

FIG. 4A is an image plane of the middle portion of the photoresist layer obtained after a simulation with an exposure of the sbar with a 15% overdose with a mask that has been adjusted based on data obtained from the wafer. As it can be seen from FIG. 4A, the sbar does not form a pattern on the wafer after the exposure.

In FIG. 4B, when the image plane is set at the top surface of the photoresist layer, the image plane corresponds to the simulated sbar after the mask is adjusted based on data obtained by a 15% over-exposure. It can be seen from FIG. 4B, a pattern (a black spot) is formed on a wafer through the exposure of the sbar, as indicated by an arrow 402. Therefore, a simulation of sbar may produce different results according to the OPC mask model formed at different locations.

FIG. 4C shows a pattern obtained after exposure of the real pattern. In this embodiment, the OPC mask model is photoresist mask layer 102. The method includes obtaining data of the wafer that is associated with a middle portion of the photoresist layer 102. The method further includes correcting the mask based on the obtained data and transferring the pattern of the OPC mask model to the wafer with an exposure having an over dose of 10%. FIG. 4C is a pattern obtained after the exposure of a corrected mask with an over dose of 10%. This over dose of 10% of the exposure energy is obtained through the correlation between the simulated overexposure and the real exposure of the wafer. As shown in FIG. 4C, the pattern after the exposure contains a black spot, as indicated by arrow 404.

As described above, due to the relatively small size of the sbar, light intensity of the sbar is much smaller than the light intensity of the main pattern. When the simulation of the sbar obtained by the image plane of the light provided to the middle portion of the photoresist is inaccurate, the image obtained in the exposed wafer is defective. When the image plane is formed on the top surface of the photoresist layer the simulated sbar pattern is the same as the pattern of the wafer after the exposure, the simulation result is thus, more accurate.

According to embodiments of the present invention, a method includes moving an image plane of the middle portion of a OPC mask model to the OPC mask model top region, and forming a new OPC model. The method further includes, using the OPC mask as a scattering bar OPC model, simulating an exposure of the scattering bar OPC model to obtain a profile of the scattering bar OPC model, and testing the obtained profile. The scattering bar OPC model is used only for the exposure simulation to obtain the profile. The simulation result of the sbar OPC profile is consistent with the simulation result of the real wafer exposure, so that the method is more efficient and accurate for detecting the image of scattering bar.

Embodiments of the present invention provide a method that is more effective and accurate for detection and monitoring of the sbar. According to the present invention, the method may also establish a real correlation between a simulated amount of exposure energy of the sbar and an exposure energy amount of a wafer (when the sbar pattern is transferred onto the wafer). Thus, the amount of exposure energy of a wafer can be Obtained by correlating with the simulated amount of exposure energy, so that the method is more convenient and efficient.

Figure 5:
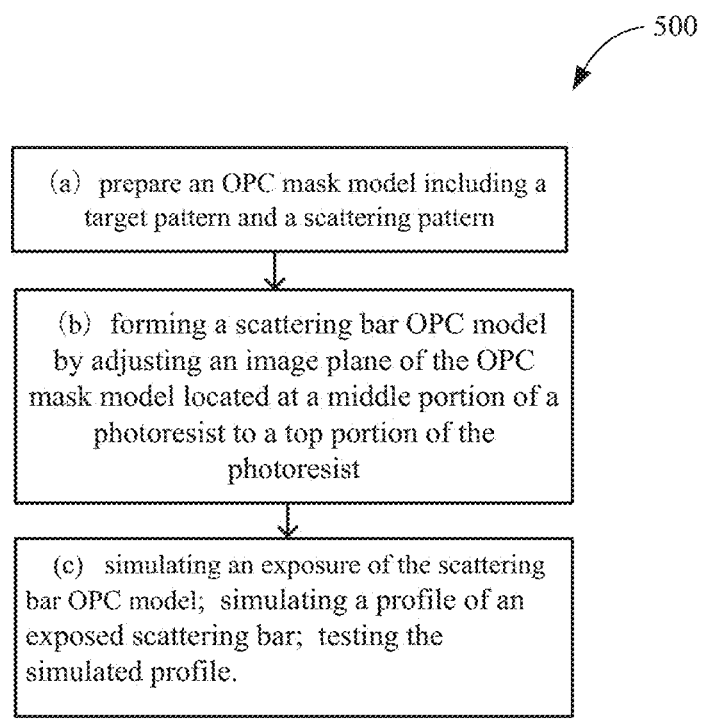
FIG. 5 is a flow chart of a method for monitoring a simulated image of a scattering bar according to an embodiment of the present invention.

FIG. 5 is a flow diagram of a method 500 according to an embodiment of the present invention. Method 500 includes the following steps:

Step (a): Preparing an OPC mask model, the OPC mask model including a main pattern and a scattering bar pattern;

Step (b): Forming a scattering bar OPC model by adjusting the an image plane of the OPC mask model located at the middle portion of the photoresist layer to the top portion of the photoresist layer;

Step (c): Simulating an exposure of the scattering bar OPC model, simulating a profile of the exposed scattering bar model, and testing the simulated profile.

The present invention has been described by the above embodiments, it is to be understood that the embodiments described above are illustrative and not restrictive. It is to be understood that the embodiments are not limited to the disclosed embodiments, and are intended to cover various modifications and equivalent arrangements included within the spirit and scope of the appended claims.

What is claimed is:

1. A method of testing a scattering bar by simulation, the method comprising:
    preparing an OPC mask model including a main pattern and a scattering bar pattern;
    forming an image plane of the OPC mask model located at a middle portion of a photoresist layer;
    forming a scattering bar OPC model by refocusing the image plane of the OPC mask model located at the middle portion of the photoresist layer to a top portion of the photoresist layer;
    simulating an exposure of the scattering bar OPC model with an exposure dose of about 15% over a normal dose;
    simulating a profile of the exposed scattering bar OPC model;
    testing the simulated profile;
    conducting a real wafer exposure of the OPC mask model to evaluate at least one simulation result; and after testing the simulated profile:
    while simulating an exposure of the scattering bar OPC model, establishing a correlation between the simulated 15% overexposure dose of the scattering bar pattern and a real exposure dose of a wafer of about 10% over the nominal dose.

2. The method of claim 1, further comprising: prior to preparing an OPC mask model,
    obtaining first data associated with an image plane of the main pattern located in the middle portion of the photoresist layer; and
    generating the OPC mask model based on the obtained first data.

3. The method of claim 2, further comprising, after forming a scattering bar OPC model:
    obtaining second data associated with a scattering bar located at the top portion of the photoresist layer; and
    adjusting the scattering bar OPC model based on the obtained second data.

4. The method of claim 2, further comprising:
    simulating the main pattern based on the OPC mask model; and
    monitoring an image of the main pattern based on a simulation result.

5. The method of claim 1, further comprising, after forming a scattering bar OPC model:
    obtaining data associated with a scattering bar located at the top portion of the photoresist layer; and
    adjusting the scattering bar OPC model based on the obtained data.

6. The method of claim 1, wherein establishing a correlation is through a test pattern of the scattering bar.

7. The method of claim 1, wherein preparing an OPC mask model comprises sequentially depositing a bottom antireflective layer, a photoresist layer, and a top coat layer.

8. The method of claim 7, wherein adjusting an image plane comprises adjusting an interface between the photoresist layer and the top coat layer.

9. The method of claim 1, further comprising:
    simulating the main pattern based on the OPC mask model; and monitoring an image of the main pattern based on a simulation result.

10. The method of claim 1, further comprising:
disposing the scattering bar around the main pattern to improve an image contrast.

11. The method of claim 1, wherein the scattering bar has a rectangular shape, a square shape, or one or more irregular shapes.

12. The method of claim 1, further comprising:
overexposing the scattering bar OPC model to perform an image simulation.

13. The method of claim 1, wherein forming the scattering bar OPC model is used only for the simulation of the scattering bar profile.

\* \* \* \* \*